United States Patent
Ogane

(10) Patent No.: US 7,317,334 B2
(45) Date of Patent: Jan. 8, 2008

(54) VOLTAGE TRANSLATOR CIRCUIT AND SEMICONDUCTOR MEMORY DEVICE

(75) Inventor: Junichi Ogane, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 1655 days.

(21) Appl. No.: 10/080,405

(22) Filed: Feb. 25, 2002

(65) Prior Publication Data

US 2003/0071656 A1  Apr. 17, 2003

(30) Foreign Application Priority Data

Sep. 20, 2001  (JP) ......................... 2001-286903

(51) Int. Cl.
*H03K 19/0175* (2006.01)

(52) U.S. Cl. .......................... 326/81; 326/87
(58) Field of Classification Search ............ 326/81, 326/80, 82, 83, 86, 87, 62
See application file for complete search history.

(56) References Cited

U.S. PATENT DOCUMENTS 4,931,670 A * 6/1990 Ting ......................... 326/117
5,764,077 A * 6/1998 Andresen et al. ............ 326/34

FOREIGN PATENT DOCUMENTS

EP       829881 A2 *  3/1998

\* cited by examiner

*Primary Examiner*—Daniel Chang
*Assistant Examiner*—James H Cho
(74) *Attorney, Agent, or Firm*—Volentine Francos, PLLC

(57) ABSTRACT

A voltage translator circuit capable of operating at high speed, saving the power consumption, and forming to have a smaller circuit area. When the output level of a decoder 110 is changed from the potential GND to the potential VDD, a pMOS transistor 125 is turned off, and the gate of nMOS transistor 124 comes to have a high impedance. Because of this, the self-boost effect acts on the gate of the nMOS transistor 124 to push up the source potential of the nMOS transistor 124. Consequently, the gate potential of the pMOS transistor 122 is abruptly raised, and this pMOS transistor 122 is turned off at high speed. The pMOS transistor 122 being turned off at high speed, the penetration current flowing through the transistors 121 and 122 is reduced and the electric potential of the word line WL falls at high speed. This voltage translator circuit can be achieved only by adding a low voltage pMOS transistor 125 to the prior art voltage translator circuit, thus enabling the circuit area of the voltage translator circuit to make smaller.

14 Claims, 9 Drawing Sheets

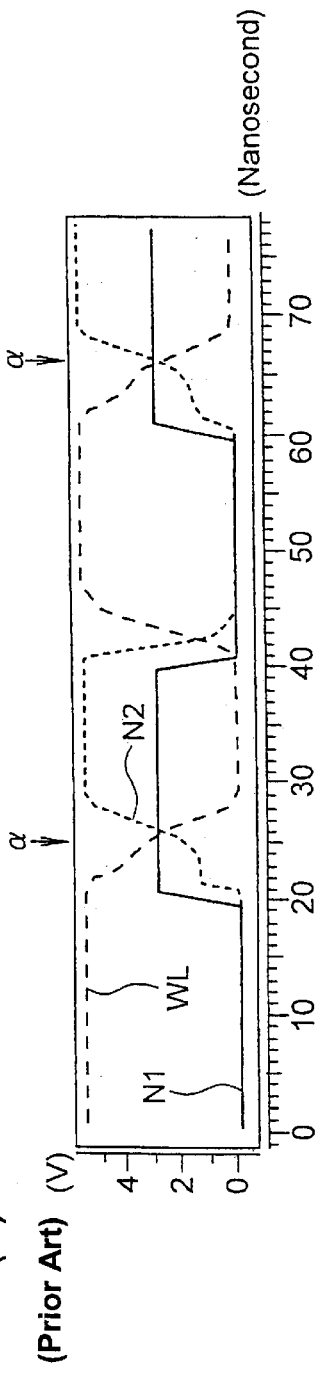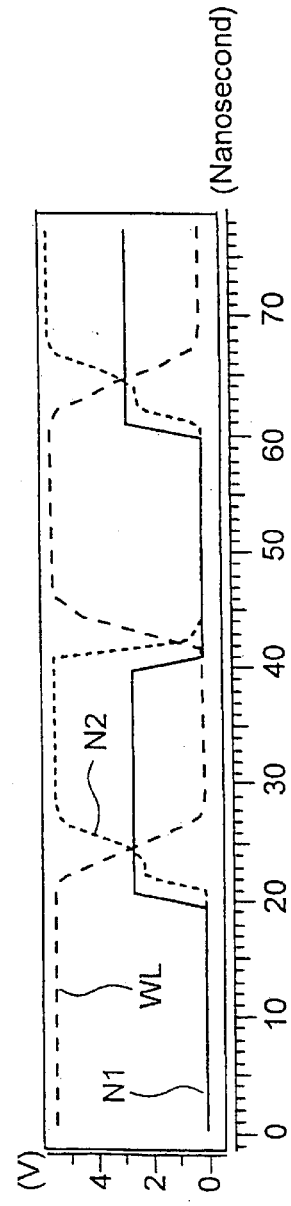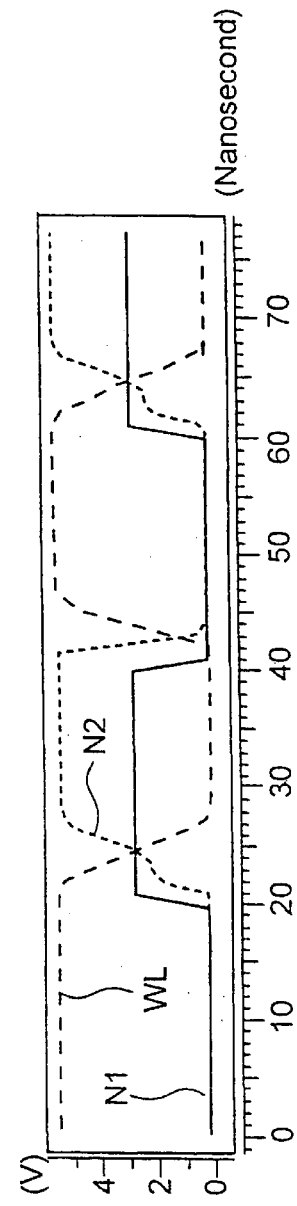
FIG.2(A) (Prior Art)
FIG.2(B) (Prior Art)
FIG.2(C)

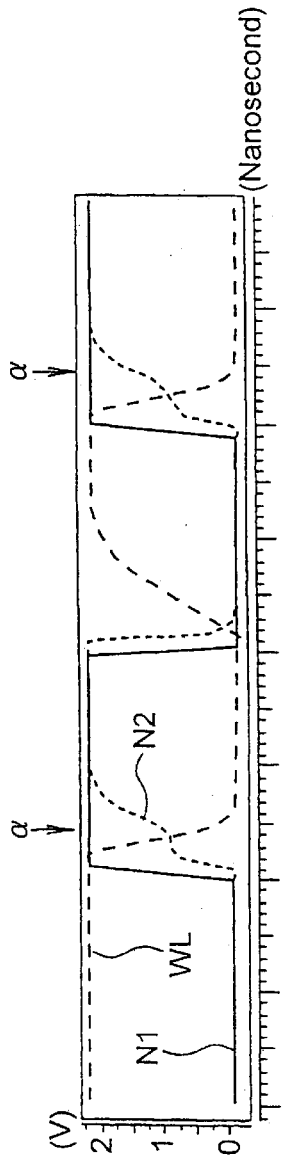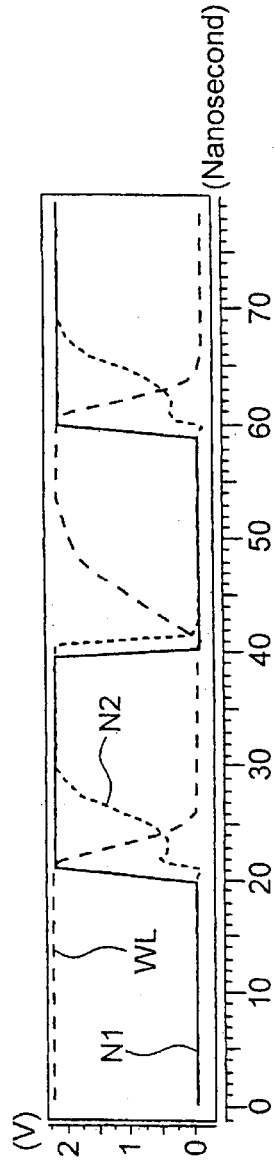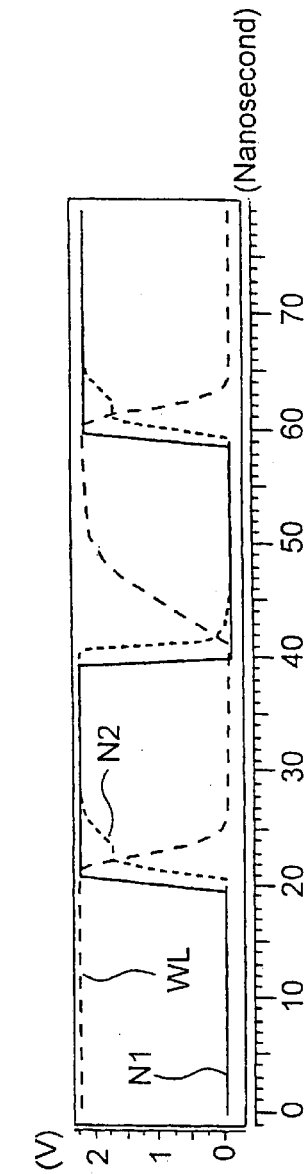
FIG.4(A) (Prior Art)
FIG.4(B) (Prior Art)
FIG.4(C)

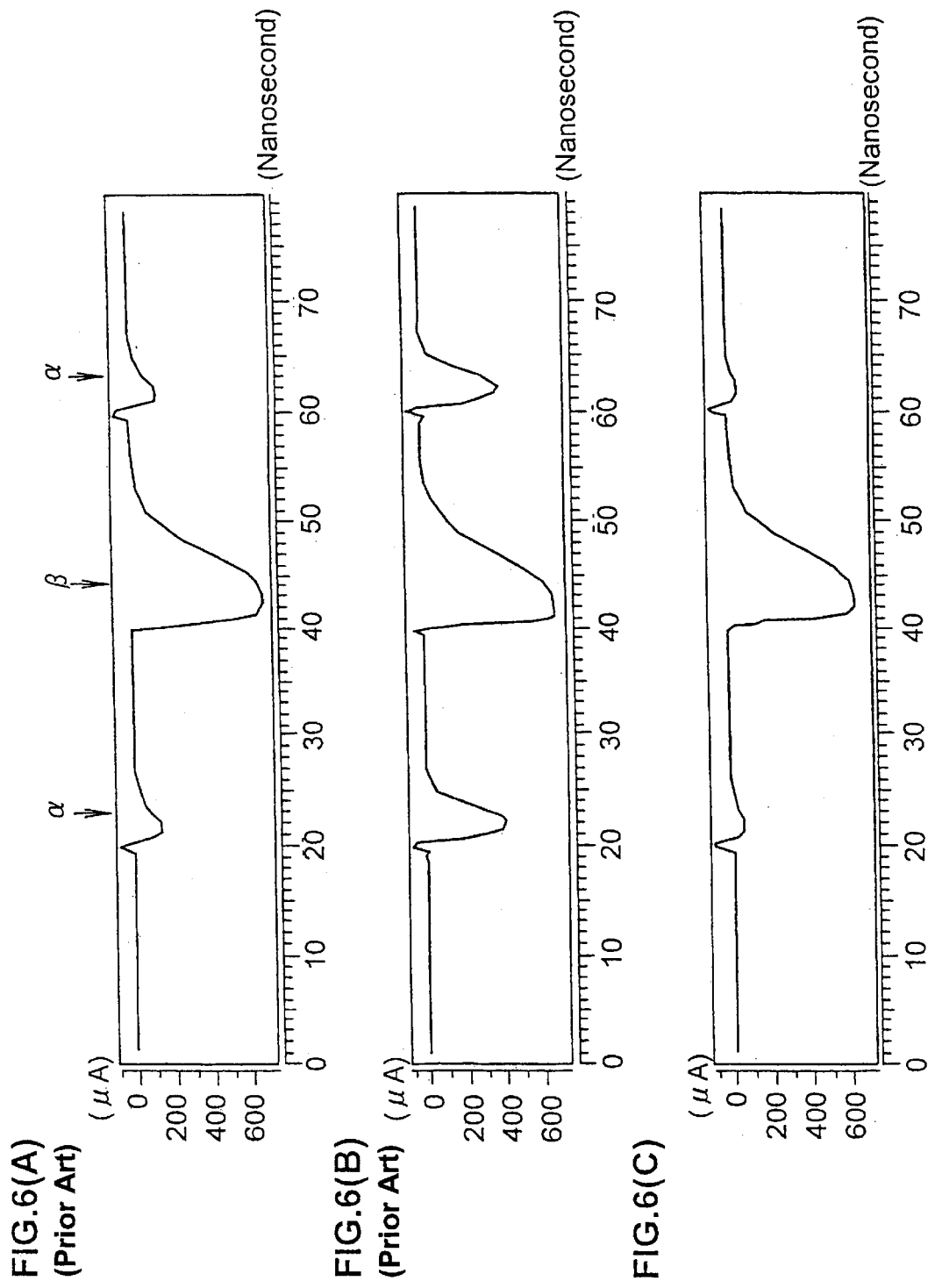

VOLTAGE TRANSLATOR CIRCUIT AND SEMICONDUCTOR MEMORY DEVICE

BACKGROUND OF THE INVENTION

1. Field of the Invention

The present invention relates to a voltage translator circuit and a semiconductor memory device, and more particularly, relates to a voltage translator circuit applicable to a driving circuit of a semiconductor memory device like a flash electrically erasable programmable read only memory (referred to as "flash EEPROM" hereinafter) and so forth.

2. Related Art

In some kinds of semiconductor memory devices, it is required to supply a plurality of different voltages to the word line depending on the operation mode of the memory device. In case of the flash EEPROM, for instance, the high electric potential (12V for instance) is applied to the word line in the data erasing operation and the data writing operation as well while the low electric potential (3.3V for example) is applied to the word line in the data reading operation. Accordingly, in the semiconductor memory devices similar to the above, it is needed to constitute such a driving circuit that the electric potential adaptable to different operation modes can be applied to the word line. Hereinafter, the expression "electric potential" will be written as "potential" in this specification just for simplification.

So far, there have been proposed various techniques for converting the voltage to be applied to the word line. For instance, it is known that the Japanese Patent Publication No. 10-149,693 discloses such voltage conversion technique. According to this technique as disclosed, the voltage translator circuit is set up between a row decoder and the word line.

FIG. 8 of the accompanying drawings is a circuit diagram showing a circuit identical to the voltage translator circuit as shown in FIG. 1 of the above Japanese Patent Publication.

Referring to FIG. 8, a buffer 811 and a NAND gate 812 constitute the final stage of the row decoder. From the NAND gate 812 is a signal with an ordinary voltage amplitude (high level=VDD, low level=GND) outputted. The voltage translator circuit 820 converts this signal into a signal with a large voltage amplitude (high level=VX, low level=VXGND) and supplies the converted to a plurality of predetermined word lines, which will be referred to as "the word line WL" hereinafter, because they are designated, in a lump, by using a single reference sign "WL" in the related figures, that is, FIGS. 1, 7, 8 and 9.

The voltage translator circuit 820 is provided with a MOS transistor of the n-conductive type (referred to as "nMOS transistor" hereinafter) 821 for pulling down the potential of the word line WL to the potential VXGND and a MOS transistor of the p-conductive type (referred to as "pMOS transistor" hereinafter) 822 for pulling up the potential of the word line WL to the potential VX. When the high level voltage (VDD) is outputted from a NAND gate 812, the nMOS transistor 821 is turned on while the pMOS transistor 822 is turned off, so that the potential of the word line WL is pulled down to the potential VXGND. On one hand, when the low level voltage (GND) is outputted from the NAND gate 812, the nMOS transistor 821 is turned off while the pMOS transistor 822 is turned on, so that the potential of the word line WL is pulled up to the high level potential VX. Furthermore, the voltage translator circuit 820 is provided with a pMOS transistor 823 for having the pMOS transistor 822 completely turned off when the potential of the word line WL is at a low level (VXGND). This pMOS transistor 823 is turned on as the nMOS transistor 821 is turned on and pulls up the gate potential of the pMOS transistor 822 up to the high level potential VX. In addition, the voltage translator circuit is provided an nMOS transistor 824 for preventing the drain potential VX of the pMOS transistor 823 from giving any ill effect to the row decoder.

FIG. 9 of the accompanying drawings is a circuit diagram showing a circuit identical to the voltage translator circuit as shown in FIG. 3 of the above Japanese Patent Publication. The voltage translator circuit shown in FIG. 9 is for improving the operation speed of the voltage translator circuit of FIG. 8, that is, for making it much faster.

In FIG. 9, a NOR gate 911 and a buffer 912 constitute the final stage of the row decoder. A voltage translator circuit 920 is provided with the same transistors as those 821 through 824 of the above voltage translator circuit 820 and is further provided with an nMOS transistor 921.

The NOR gate 911 having been changed from the low level (GND) to the high level, the nMOS transistor 921 is turned on and pulls down the gate potential of the pull-up transistor 822 to the low level (GND). With this, it become possible to turn on the pull-up transistor 822 at high speed, thus making it possible to pull up the potential of the word line WL to the high level (VX) at high speed.

Furthermore, in the voltage translator circuit 920, the gate of the nMOS transistor 824 is connected with the word line WL. With this, the pMOS transistor 823 having been turned on, the gate potential of the pull-up transistor 822 is set to be the potential that is a little higher than the output potential of the buffer 912. Because of this, when the output potential of the buffer 012 changes from the low level (GND) to the high level (VDD), the gate potential of the pull-up transistor 822 is increased at high speed, so that the turn-off operation of the pull-up transistor 822 is got speeded up, thus the pull-down of the potential of the word line WL being also got speeded up.

As described above, in case of the voltage translator circuit 920, the gate potential of the pull-up transistor 822 can be pulled down at high speed by providing the nMOS transistor 921. However, while the pMOS transistor 823 is turned on, the high voltage VX is applied between the source and drain of the pMOS transistor 921. Because of this, the pMOS transistor 921 has to be constituted such that it can withstand the high voltage applied thereto. That is, it is needed to elongate the length of the gate of the nMOS transistor 921 and at the same time, to increase the thickness of the gate oxide film of the same. Still further, as it is required to operate the nMOS transistor 921 at high speed, the nMOS transistor 921 can not help having a large dimension, that is, occupying a large circuit area on the semiconductor chip.

In addition, due to the provision of such a nMOS transistor 921 as occupies a large circuit area, the voltage translator circuit 920 comes to invite such a defect that the power consumption thereof increases. As described above, in the flash EEPROM, the high potential is applied to the word line WL in the data erasing operation and in the data writing operation as well while the low potential to the degree of the potential VDD is applied to the word line WL in the data reading operation. If the potential VX is very high, the pull-up transistor 822 operates at high speed. However, if the potential VX is low to the degree of the potential VDD, it takes a longer time for the gate potential of the pull-up transistor 822 to change from the low level to the high level. Because of this, the turn-off speed of the pull-up transistor 822 becomes slow. Consequently, if the potential VX is not sufficiently high but low, the period of on-time of both transistors 821 and 822 becomes longer, thus the penetration current flowing therethrough being increased.

For reasons as described in the above, there has been desired the appearance of such a voltage translator circuit that is able to operate at high speed, occupy a smaller circuit area, and consume a smaller electric power.

The present invention has been made in view of the shortcomings as described above, with regard to the prior art voltage translator circuit as described above. It is, therefore, a principal object of the invention is to provide a novel and improved voltage translator circuit capable of operating at high speed neither inviting enlargement of the circuit area nor increasing in the electric power consumption.

SUMMARY OF THE INVENTION

According to the invention, there is provided a voltage translator circuit which includes a logical circuit portion outputting an electric potential supplied from the first power source line or the second power source line, in the form of a logical signal, from the logical output terminal thereof; the third power source line; the fourth power source line as set to be the electric potential equal to or higher than that of said second power source line; and a voltage output portion provided with the first through the fifth transistors.

In the above voltage translator circuit, the first transistor is a transistor of the first conductive type, of which the source is connected with the third power source line; the drain is connected with the voltage output terminal of the voltage output portion, and the gate is connected with the logical output terminal; the second transistor is a transistor of the second conductive type, of which the source is connected with the fourth power source line, and the drain is connected with the voltage output terminal; the third transistor is a transistor of the second conductive type, of which the source is connected with the fourth power source line, the drain is connected with the gate of the second transistor, and the gate is connected with the voltage output terminal; the fourth transistor is a transistor of the first conductive type, of which the source is connected with the gate of the second transistor, and the drain is connected with the logical output terminal; and the fifth transistor is a transistor of the second conductive type, of which the source is connected with the second power source line, the drain is connected with the gate of the fourth transistor, and the gate is connected with the logical output terminal.

According to the invention, as the fifth transistor is provided between the control terminal of the fourth transistor and the second power source line, the second transistor can be turned off at high speed owing to the self-boost effect. Accordingly, the voltage translator circuit operates at high speed, and it becomes possible to make smaller the penetration current caused at the time when the output voltage level is switched. In addition, the fifth transistor can be formed by using a low withstanding voltage transistor, so that the necessary circuit area for forming it becomes smaller.

The invention will now be described in detail in the following, with reference to the accompanying drawings. In the drawings, the size and form of respective elements constituting the voltage translator circuit according to the invention and the arrangement relation among them are shown so as to give a general idea to the extent of assisting the better understanding of the invention. Furthermore, the numerical values as used in the following description are not definitive but just illustrative to the last.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

In the drawing,

FIGS. 2(A) through 2(C) are graphs for describing the operation of the voltage translator circuit, FIGS. 2(A) and 2(B) being for describing the operation of the prior art voltage translator circuit, and FIG. 2(C) being for describing the operation of the voltage translator circuit according to the first embodiment of the invention;

FIGS. 4(A) through 4(C) are graphs for describing the operation of the voltage translator circuit, FIGS. 4(A) and 4(B) being for describing the operation of the prior art voltage translator circuit, and FIG. 4(C) being for describing the operation of the voltage translator circuit according to the first embodiment of the invention;

FIGS. 6(A) through 6(C) are graphs for describing the operation of the voltage translator circuit, FIGS. 6(A) and 6(B) being for describing the operation of the prior art voltage translator circuit, and FIG. 6(C) being for describing the operation of the voltage translator circuit according to the first embodiment of the invention;

DETAILED DESCRIPTION OF THE PREFERRED EMBODIMENTS

[First Preferred Embodiment]

In the following, a voltage translator circuit according to the first embodiment of the invention will be described by way of an example wherein the voltage translator circuit is applied to the flash EEPROM.

Figure 1:
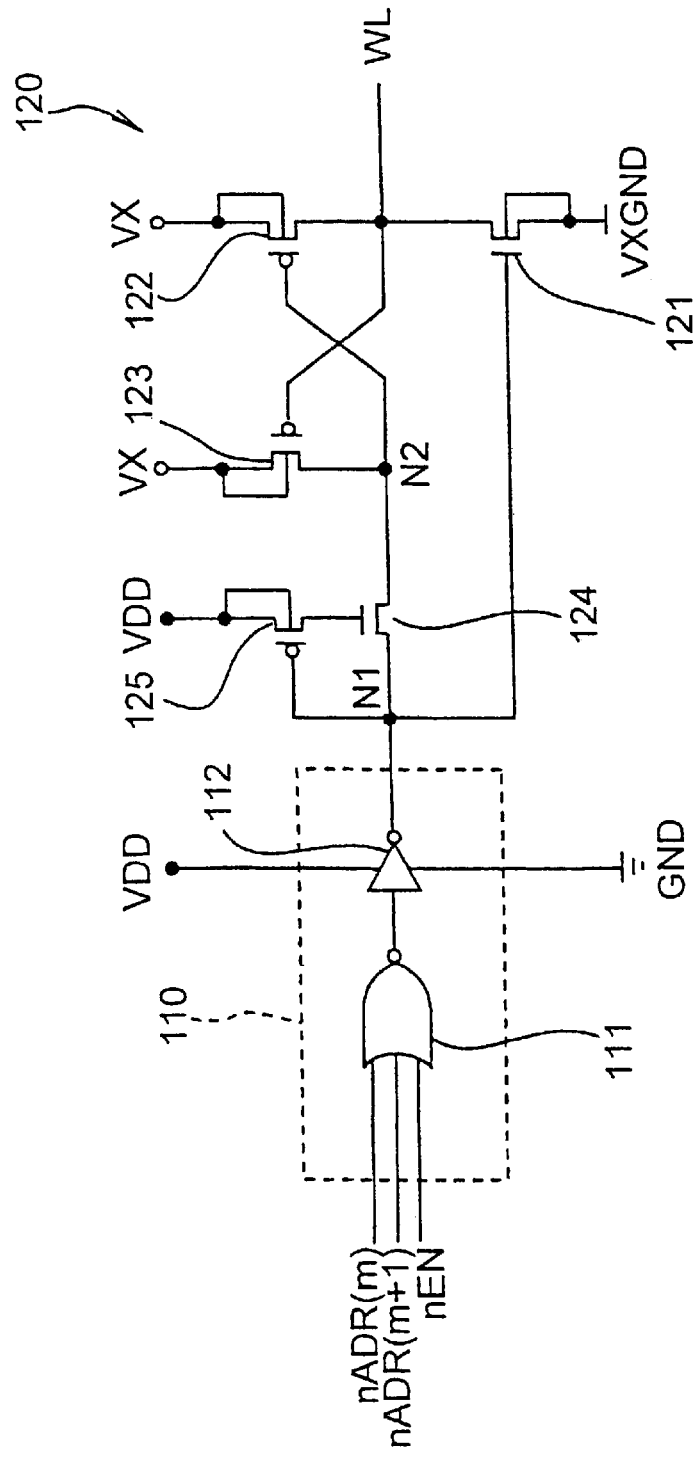
FIG. 1 is a circuit diagram of a voltage translator circuit according to the first embodiment of the invention.

FIG. 1 is a circuit diagram showing the essential constitution of a flash EEPROM.

The flash EEPROM as shown in this figure is provided with a row decoder 110, a voltage output portion 120, and the word line WL.

Furthermore, the row decoder 110 is provided with a NOR gate 111 and a buffer 112. Signals nADR(m), nADR(m+1) and an activated signal nEN are inputted to the NOR gate 111. The signals nADR(m) and nADR(m+1) indicate the inverted values of the mth and (m+1)th bits of an address signal, respectively. Still further, the activated signal nEN is a signal following the negative logic system, so that it takes the low level in the activated state while it takes the high level in the non-activated state. The buffer 112 inverts the output value of the NOR gate 111 to output the inverted. The buffer 112 is connected with a ground line GND (referred to as "first power source line hereinafter") and a power source line VDD (referred to as "second power source line" hereinafter) as well. That is, the buffer 112 outputs the potential supplied from the ground line GND, as a low level signal, and outputs the potential supplied from the power source line VDD, as a high level signal.

The voltage output portion 120 is provided with the first through the fifth MOS transistors 121 through 125. The first transistor 121 is an nMOS transistor, of which the source and well are commonly connected with a power source line VXGND (referred to as the third power source line), and the drain is connected with the word line WL, and the gate is connected with the output terminal of the row decoder 110, that is, the output terminal of the buffer 112. The second transistor 122 is a pMOS transistor, of which the source and well are commonly connected with a power source line VX (referred to as "fourth power source line" hereinafter), and the drain is connected with the word line WL. The third transistor 123 is a pMOS transistor, of which the source and well are commonly connected with the power source line VX, and the gate is connected with the word line WL. The fourth transistor 124 is an nMOS transistor, of which the source is connected with the gate of the pMOS transistor 122, and the drain is connected with the output terminal of the row decoder 110. The fifth transistor 125 is a pMOS transistor, of which the source and well are commonly connected with the power source line VDD, the drain is connected with the gate of the nMOS transistor 124, and the gate is connected with the output terminal of the row decoder 110.

The word line WL is provided for every row and a lot of memory cells (not shown) are connected therewith. Actually, the flash EEPROM memory array is provided with a large number of word lines (not shown), and each word line is provided with the same row decoder 110 and voltage output portion 120 as those shown in FIG. 1.

The driving potential for driving the integrated circuit constituting the flash EEPROM is made use of as the supply potential supplied from the power source line VDD. The potential of the ground GND is the earth potential. On one hand, each supply potential supplied from the power sources VX and VXGND is varied in response to the operation mode of the flash EEPROM (data writing mode, data erasing mode, data reading mode and so forth).

In the next, the operation of the voltage output portion 120 as shown in FIG. 1 will be described with reference to a graph of FIG. 2(C). This figure describes the simulation result of the operation of the voltage output portion 120 as shown in FIG. 1 when VDD=2.7V and VX=5.5V Now, it is assumed that all the signals nADR(m), nADR(m+1) and nEN are at the low level (GND) in the initial state. At this time, the output of the NOR gate 111 is at the high level (VDD), so that the output potential (i.e. the potential of the node N1) of the buffer 112 becomes the low level (GND). Because of this, the pMOS transistor 125 is turned on, and the gate potential of nMOS transistor 124 becomes the high level (VDD). With this, the nMOS transistor 124 is turned on. Thus, the potential of the node N2 becomes the low level (GND). When the node N2 is at the low level GND, the pMOS transistor 122 is turned on. When the node N1 is at the low level GND, the nMOS transistor 121 is turned off. Accordingly, the potential of the word line WL becomes the high level (VX). Because of this, the pMOS transistor 123 is turned off.

In the next, if one or more of the signals nADR(m), nADR(m+1) and nEN are changed to the high level (VDD), the output of the NOR gate 111 becomes the low level (GND), so that the output potential of the buffer 112 (i.e. the potential of the node N1) goes up. Because of this, the nMOS transistor 121 is turned on. In addition, if the potential of the node N1 goes up, the pMOS transistor 125 is turned off, thereby the gate of the nMOS transistor 124 entering the state of high impedance. At this time, the nMOS transistor 124 maintains the turn-on state thereof. Consequently, when the potential of the node N1 has reached the high level (VDD), the potential of the node N2 becomes VDD-Vt where Vt is the threshold voltage of the nMOS transistor 124. With this, the self-boost effect is generated to act on the gate of the nMOS transistor 124. That is, the source potential of the nMOS transistor 124 raises the gate potential thereof. The ultimate gate potential of the nMOS transistor 124 is determined by the built-in potential of the diffusion region (i.e. the drain diffusion region of the pMOS transistor 125) connected with this gate. Here, letting Vf be this built-in potential, the gate potential of the nMOS transistor 124 rises up to the potential VDD+Vf owing to the self-boost effect. Furthermore, as the gate potential makes this rise, the source potential (i.e. the potential of the node N2) of the nMOS transistor 124 also goes up by the built-in potential Vf. In other words, the potential of the node N2 rises up to VDD+Vf−Vt. The drain current of the pMOS transistor 122 decreases as the potential of the node N2 rises. As described above, since the nMOS transistor 121 is in the turn-on state, the potential of the word line WL falls in correspondence with the decrease in the drain current of the pMOS transistor 122. When the potential of the word line WL falls up to a predetermined value, the pMOS transistor 123 is turned on. As a result, the gate potential of the pMOS transistor 122 rises up to the high level (VX), and the pMOS transistor 122 is completely turned off. With this, the potential of the word line WL becomes the low level (VXGND), completely.

In the voltage output portion 120 according the first embodiment, the threshold voltage Vt of the nMOS transistor 124 and the built-in voltage Vf on the drain side of the nMOS transistor 125 are set such that Vt becomes larger than Vf (i.e. Vt>Vf). The relation Vt>Vf being satisfied, the source potential VDD+Vf−Vt of the nMOS transistor 124 becomes lower than the drain potential VDD of this nMOS transistor 124. In this case, if the pMOS transistor 123 is turned on and the potential of the node N2 rises, the nMOS transistor 124 is turned off. Accordingly, even if the potential of the node 2 becomes higher than the drain potential VDD of the nMOS transistor 124, no current flows from the node 2 to the node 1, so that the potential of the node N2 can rise up to the high level (VX), completely. On one hand, if Vt is equal to or smaller than Vf (Vt□ . . . Vf), the source potential VDD+Vf−Vt of the nMOS transistor 124 becomes equal to or higher than the drain potential VDD of this transistor 124. In this case, even if the pMOS transistor 123 is turned on and the potential of the node N2 is raised, the nMOS transistor 124 can not be turned off. Because of this, if the potential of the node 2 becomes higher than the potential VDD, the current comes to flow from the node 2 to the node N1, so that the potential of the node N2 can not rise up to the high level (VX), completely. In this case, as the pMOS transistor 122 can not be completely turned off, the potential of the word line WL can not reach the low level (VXGND), completely.

After the above, assuming that all the signals nADR(m), nADR(m+1) and nEN return to the state of the low level (GND), the output of the NOR gate 111 becomes the high level (VDD), so that the output potential of the buffer 112 (i.e. the potential of the node N1) becomes the low level (GND). Because of this, the pMOS transistor 121 is turned on. Furthermore, the pMOS transistor 125 is turned on and the nMOS transistor 124 is turned on, too. With this, the electric charge stored on the node N2 is released to the ground line GND through the nMOS transistor 124 and an nMOS transistor (not shown) of the buffer 112. Thus, the potential of the node N2 decreases. Because of this, the nMOS transistor 122 is turned on. With this, the potential of the word line WL goes up. If the potential of this word line WL rises, the current flowing through the pMOS transistor 123 is decreased, thereby the potential of the node N2 being further decreased. When the pMOS transistor 123 is turned off, the potential of the node N2 becomes the low level (GND), thereby the pMOS transistor 122 being turned on, completely. With this, the potential of the word line WL becomes the high level (VX), completely.

As will be understood from the above description, the pMOS transistor 125 is nothing but a transistor having the function as a switch for switching the high level to the high impedance or vice versa of the gate of the nMOS transistor 124. Therefore, there is no need for the pMOS transistor 125 to be a high voltage transistor. In other words, the circuit area the pMOS transistor 125 exclusively occupies may be far smaller than that which the nMOS transistor 921 (see FIG. 9) does. Accordingly, the circuit scale of the voltage output portion 120 can be made smaller than that of the prior art voltage translator circuit 920.

Figure 8:
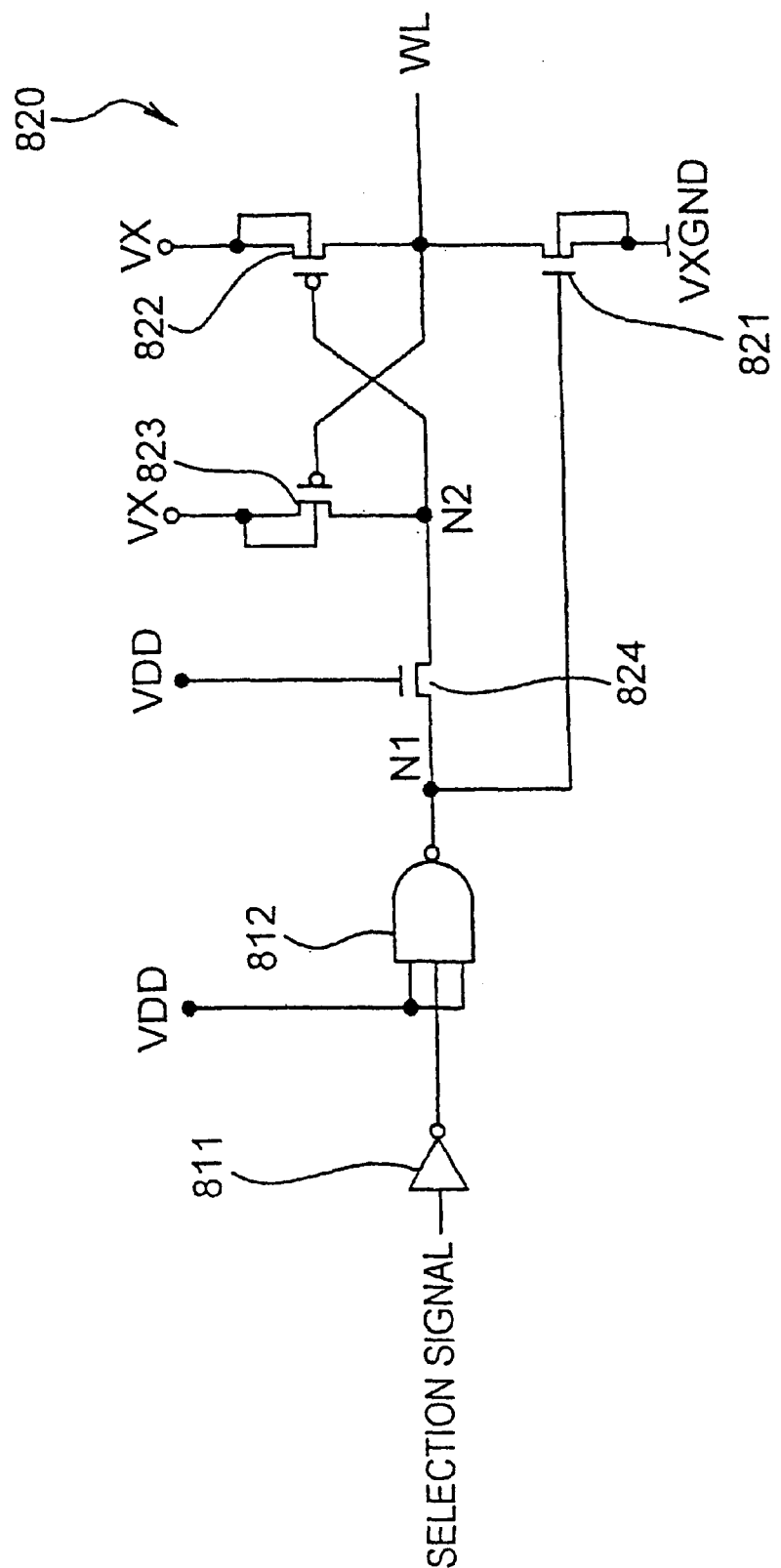
FIG. 8 is a circuit diagram of a prior art voltage translator circuit.
Figure 9:
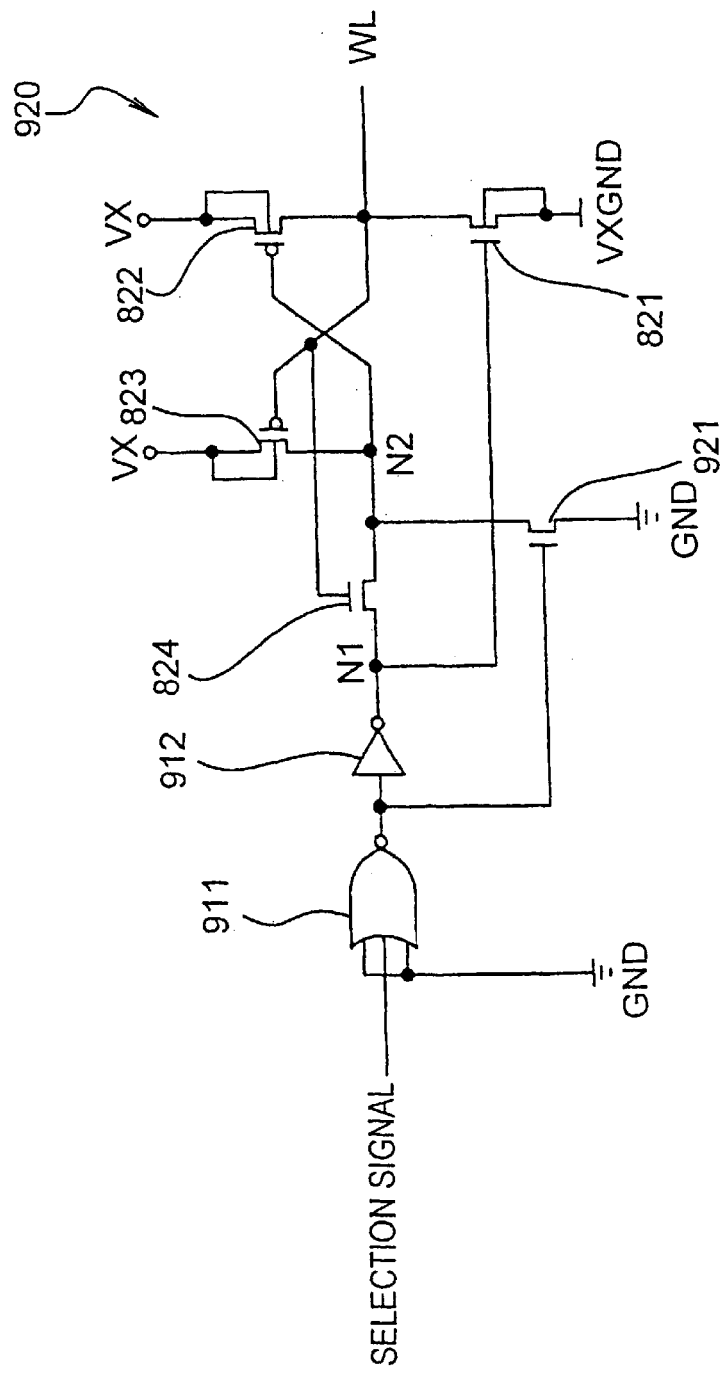
FIG. 9 is a circuit diagram of a prior art voltage translator circuit.

FIG. 2(A) describes an operation example with regard to the prior art voltage translator circuit 820 (see FIG. 8) while FIG. 2(B) describes an operation example with regard to the prior art voltage translator circuit 920 (see FIG. 9). FIGS. 2(A) and 2(B) indicate the simulation results obtained under the same condition, that is, VDD=2.7V and VX=5.5V.

As will be seen from comparison between FIGS. 2(A) and 2(C), in the voltage output portion 120 according to the first embodiment, the potential of the node N2 quickly rises in comparison with that in the prior art voltage translator circuit 820, so that the potential falling of the word line WL becomes faster (see the arrow sign f? in FIG. 2). Furthermore, as will be seen from comparison between FIGS. 2(B) and 2(C), the voltage output portion 120 according to the first embodiment shows the almost same falling speed and rising speed as the prior art voltage translator circuit 920. In other words, when VDD=2.7V and VX=5.5V, the falling speed of the voltage output portion 120 is faster than that of the voltage translator circuit 820 and is almost equal to that of the translator circuit 920.

Figures 3A, 3B, 3C:
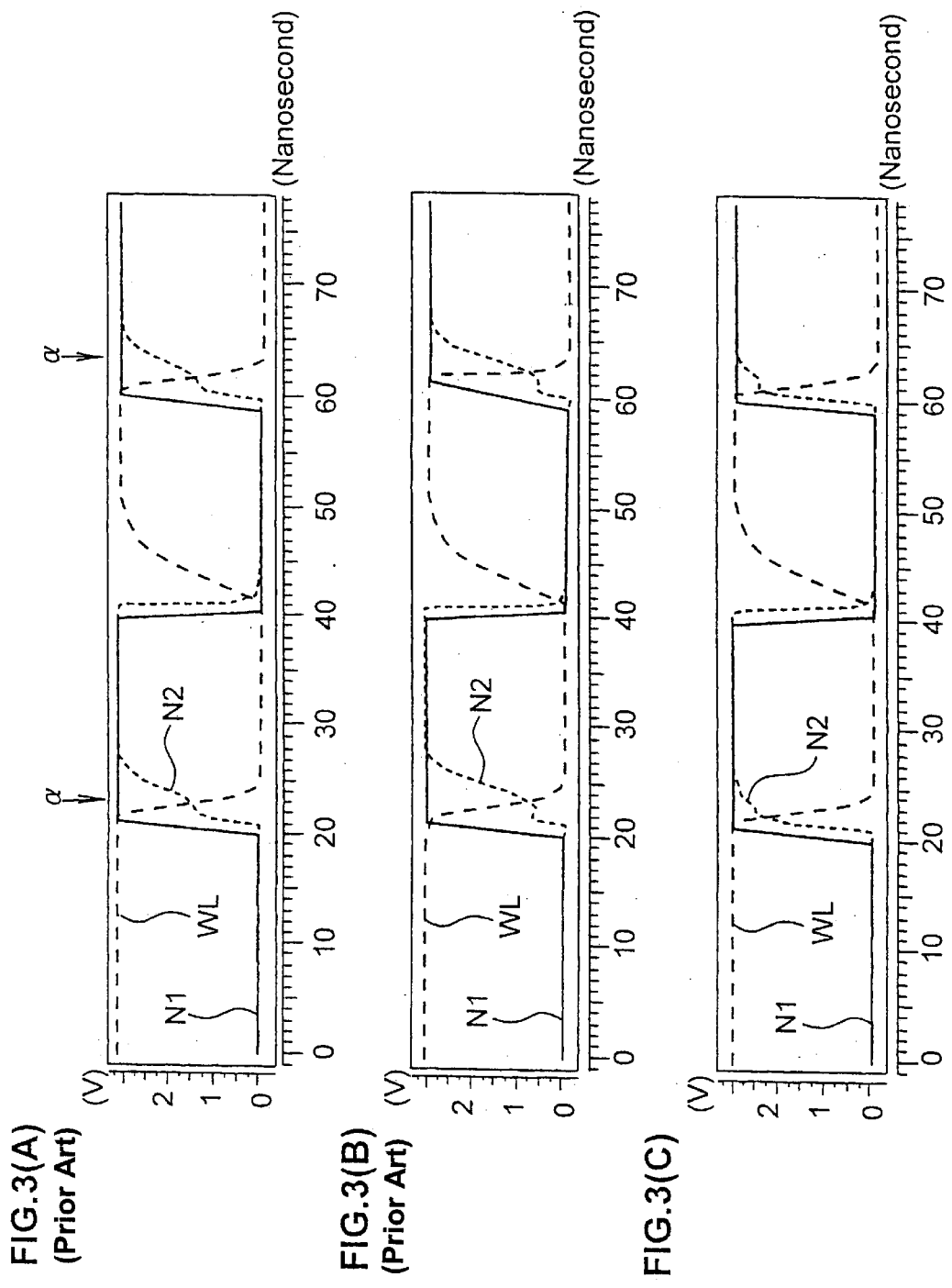
FIGS. 3(A) through 3(C) are graphs for describing the operation of the voltage translator circuit, FIGS. 3(A) and 3(B) being for describing the operation of the prior art voltage translator circuit, and FIG. 3(C) being for describing the operation of the voltage translator circuit according to the first embodiment of the invention.

FIGS. 3(A) through 3(B) indicate operation graphs when VDD=2.7V and VX=2.7V. In these figures, FIG. 3(A) shows the simulation result with regard to the voltage translator circuit 820, FIG. 3(B) shows the same with regard to the voltage translator circuit 920, and FIG. 3(C) shows the same with regard to the voltage output portion 120.

As will be seen from these figures, when the voltage VX is low, the respective voltage translator circuits 820, 920 and 120 show the almost identical falling speed. However, with respect to the rising speed, they show difference (see the arrow sign f? in FIG. 3). That is, the potential rising speed of the node N2 in the voltage output portion 120 is very fast, the same in the voltage translator circuit 820 becomes a little slower, and the same in the voltage translator circuit 920 becomes further slower. As the potential rising of the node N2 in the voltage output portion 120 is carried out at high speed, the period of time from the turn-on of the nMOS transistor 121 to the turn-off of the pMOS transistor 122 becomes so short that the penetration current flowing through these MOS transistors 121 and 122 is made so small. Contrary to this, in the voltage translator circuits 820 and 920, the period of time during which both of MOS transistors 821 and 822 are being turned on is so long that the penetration current becomes large.

The lower the voltage of the power source line VX becomes, the slower the potential rising speed of the node N2 in the voltage translator circuit becomes. FIGS. 4(A) through 4(C) indicate operation graphs when VDD=2.2 and VX=2.2. FIG. 4(A) corresponds to the voltage translator circuit 820, FIG. 4(B) corresponds to the voltage translator circuit 920, and FIG. 4(C) corresponds to the voltage output portion 120.

As will be seen from comparison between FIGS. 3 and 4, the potential falling speed of the word line WL in the voltage translator circuits 820, 920 and the voltage output portion 120 does not show a very remarkable change even if the voltage VX becomes small. In contrast to this, the potential rising speed of the node N2 in the voltage translator circuits 820 and 920 becomes slow when the voltage VX becomes low. On one hand, the potential rising speed of the node N2 in the voltage output portion 120 becomes not so slow even if the voltage VX is low.

Figures 5A, 5B, 5C:
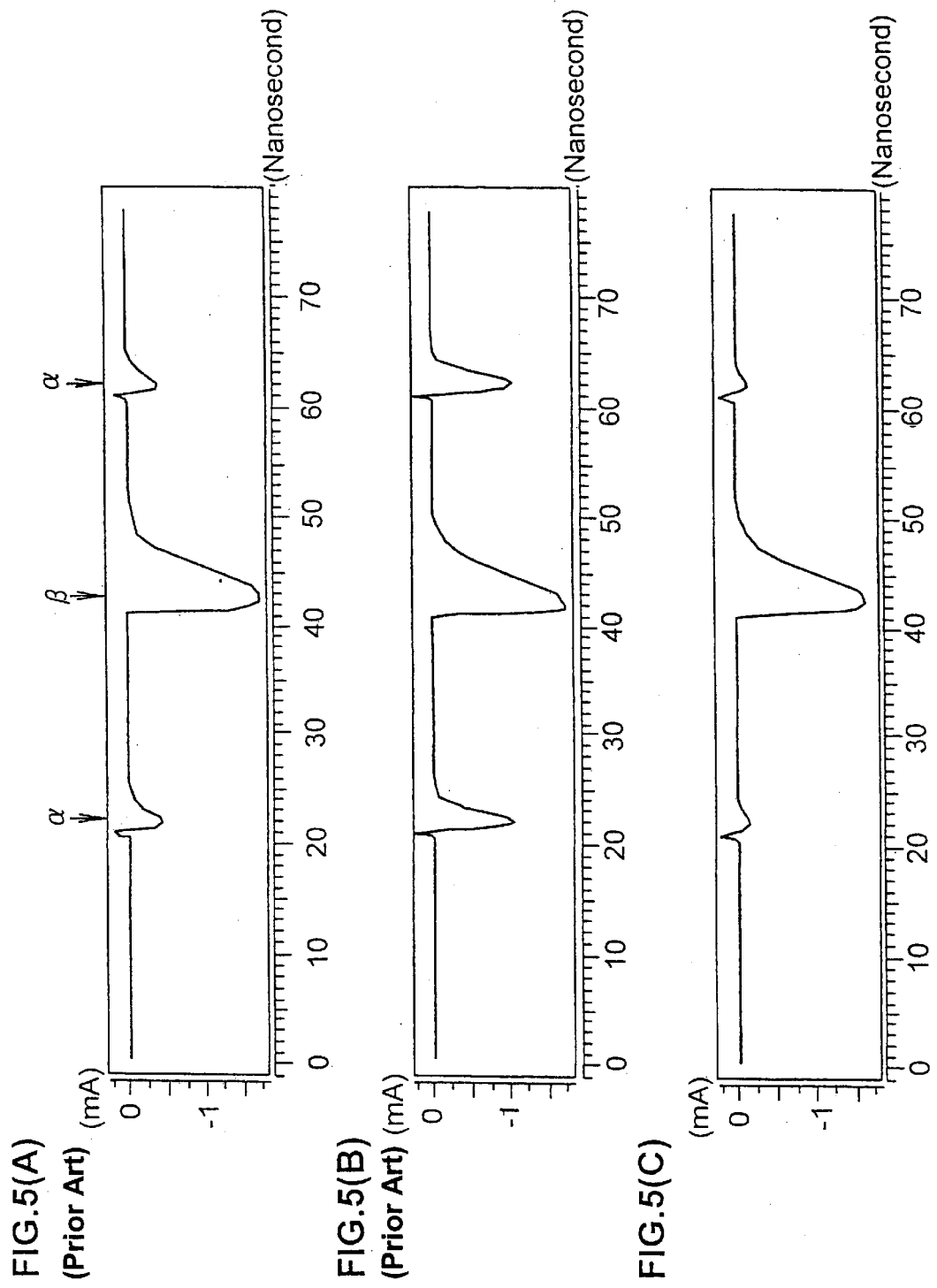
FIGS. 5(A) through 5(C) are graphs for describing the operation of the voltage translator circuit, FIGS. 5(A) and 5(B) being for describing the operation of the prior art voltage translator circuit, and FIG. 5(C) being for describing the operation of the voltage translator circuit according to the first embodiment of the invention.

FIGS. 5(A) through 5(C) and FIGS. 6(A) through 6(C) are operation graphs showing simulation results of the change with the passage of time regarding the magnitude of the penetration current in the voltage translator circuit. In these figures, 5(A) and 6(A) correspond to the voltage translator circuit 820, 5(B) and 6(B) do to the voltage translator circuit 920, and 5(C) and 6(C) do to the voltage output portion 120. Furthermore, in these figures, an arrow sign f? corresponds to the potential falling of the word line WL (potential rising of the node N2) while another arrow sign fA corresponds to the potential rising of the word line WL (potential falling of the node N2). The graphs as shown in FIGS. 5(A) through 5(C) are obtained by the operation carried out under the condition where VDD=3.3 and VX=3.3 while the graphs as shown in FIGS. 6(A) through 6(C) are obtained by the operation carried out under the condition where VDD=2.2 and VX=2.2. As will be seen from these figures, in the voltage output portion 120 according to the first embodiment, the penetration current caused when the potential of the word line WL falls, is made smaller than that of the prior art voltage translator circuits 820 and 920. Especially, the lower the voltage VX is, the larger the difference between the penetration current caused in the voltage output portion 120 and the one caused in the prior art voltage translator circuits 820, 920 becomes.

As has been discussed in the above, the voltage output portion 120 according to the first embodiment makes it possible to realize reduction of the circuit scale, operation at high speed, and reduction of the power consumption in the operation at the low voltage VX.

[Second Preferred Embodiment]

In the next, a voltage translator circuit according to the second embodiment of the invention will be described by way of an example wherein the voltage translate circuit is applied to the flash EEPROM.

Figure 7:
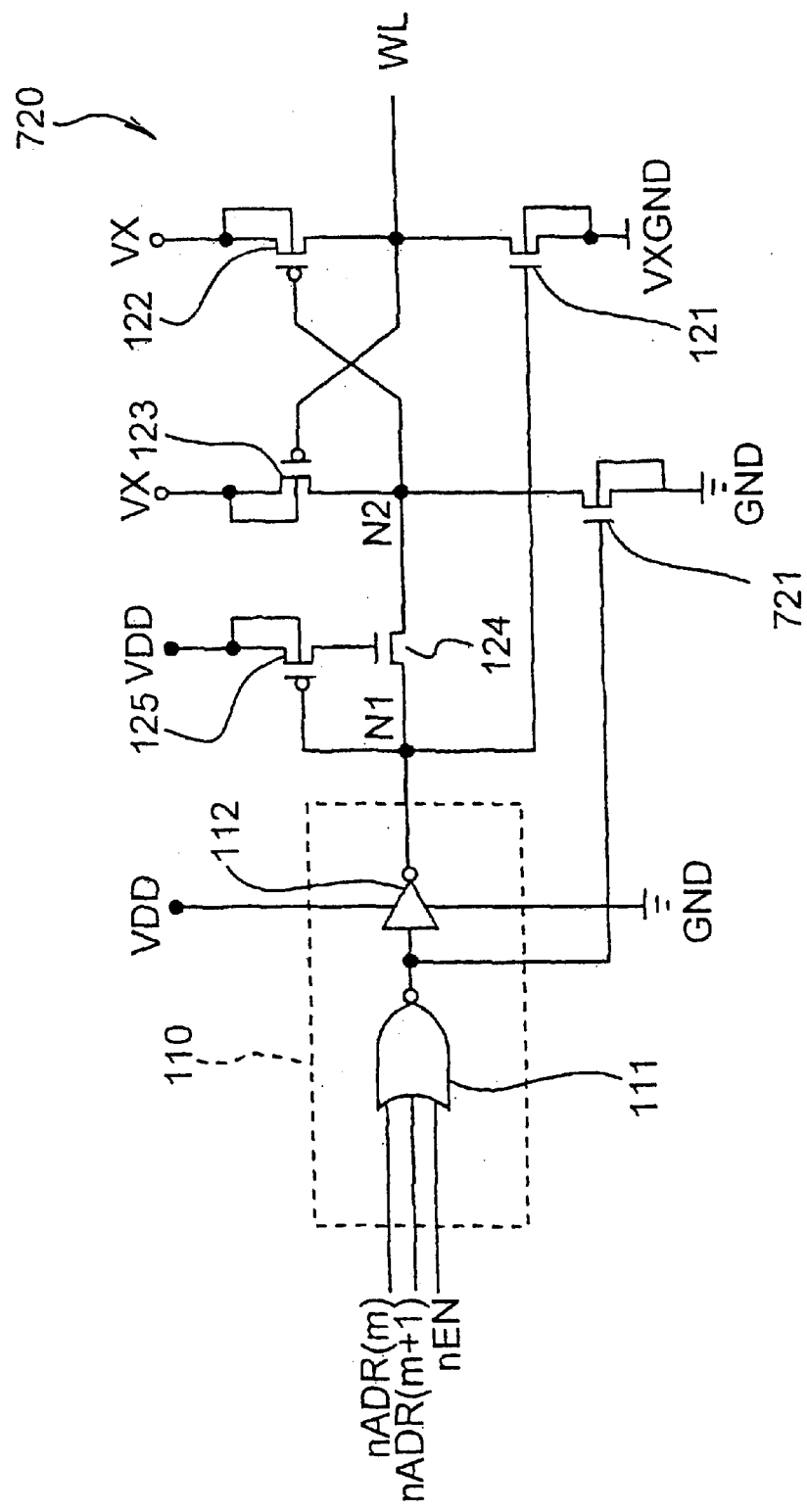
FIG. 7 is a circuit diagram of a voltage translator circuit according to the second embodiment of the invention.

FIG. 7 is a circuit diagram showing the essential constitution of the flash EEPROM. In this figure, the same constituents as those which are shown in FIG. 1 are designated with the same reference numerals and signs.

As will be seen from FIG. 7, the voltage translator circuit 720 according to the second embodiment is different from the voltage output portion 120 according to the first embodiment only in the point that the former is newly provided with an nMOS transistor 721.

The nMOS transistor 721 is provided with a source connected with the ground line GND (first power source line), a drain connected with the gate of the pMOS transistor 122, and a gate connected with the output terminal of the NOR gate 111. Therefore, the inverted value of the output from the row decoder 110 (i.e. output of the buffer 112) is applied to the gate of the nMOS transistor 721. As the high voltage VX is applied to the drain of the nMOS transistor 721, a high voltage transistor is used for the nMOS transistor 721.

In the next, there will be described the operation of the voltage translator circuit 720 as shown in FIG. 7. In this circuit 720, the potential of respective nodes N1, node N2 and word line WL is changed in the almost same manner as in the case of the voltage output portion 120 according to the first embodiment (see FIG. 2(C)).

Here again, it is assumed that all the signals nADR(m), nADR(m+1) and nEN are at the low level (GND) in the initial state. At this time, the output of the buffer 112 is at the low level. Accordingly, similar to the case of the first embodiment, the nMOS transistor 124 is turned on, the nMOS transistor 121 is turned off, the pMOS transistor 122 is turned on, and the pMOS transistor 123 is turned off. The potential of the word line WL is at the high level (VX). At this time, the output of the NOR gate 111 is at the high level, so that the nMOS transistor 721 is turned on. However, as the potential of the node N2 is at the low level (GND), the nMOS transistor 721 has no influence upon the entire operation of the voltage translator circuit 720.

In the next, if one or more of the signals nADR(m), nADR(m+1) and nEN are changed to the high level (VDD), the potential of the word line WL becomes the low level (VXGND) in the same manner as in the case of the first embodiment. At this time, the output of the NOR gate 111 is at the low level (GND), so that the nMOS transistor 721 is turned off. Because of this, the nMOS transistor 721 has no influence upon the entire operation of the voltage translator circuit 720.

After the above, if all the signals nADR(m), nADR(m+1) and nEN return to the state of the low level (GND), the nMOS transistor 124 is turned on in the same manner as in the case of the first embodiment. Furthermore, the nMOS transistor 721 is also turned on at this time. Accordingly, the electric charge stored in the node N2 flows to the ground line GND through the nMOS transistor 124 and the buffer 112, and at the same time, flows to the ground line GND through the nMOS transistor 721. After this, the potential of the word line WL becomes the high level (VX), completely, in the same manner as in the case of the first embodiment.

As described in the above, according to the second embodiment, the high voltage nMOS transistor 721 assists the release of the electric charge from the node N2 to the ground line GND.

Because of this, the second embodiment makes it possible to reduce the size of the nMOS transistor (not shown) in the buffer 112. In other words, the second embodiment makes it possible to reduce the circuit area occupied by the low voltage MOS transistor.

In addition, the total circuit area occupied by two nMOS transistors 124 and 721 in the second embodiment becomes the almost same as that which is occupied by the nMOS transistor 124 in the first embodiment.

As described in the above, according to the second embodiment, the circuit area of the non-high voltage transistor can be reduced without enlarging the circuit area of the high voltage transistor in comparison with the first embodiment. That is, according to the second embodiment, the circuit scale of the voltage translator circuit can be made smaller in comparison with the case of the first embodiment.

In addition, the voltage translator circuit 720 according to the second embodiment can realize the same high speed operation and low power consumption as realized by the voltage output portion 120 according to the first embodiment.

As has been discussed in the above, the invention can provide the voltage translator circuit capable of operating at high speed, being formed to have the smaller circuit area, and performing with the smaller power consumption.

While certain preferred embodiments have been chosen to illustrate and describe the invention, it will be understood by those skilled in the art that various changes and modifications can be made therein, without departing from the scope of the invention as defined in the appended claims.

What is claimed is:

1. A voltage translator circuit comprising:
a logical circuit portion outputting an electric potential in the form of a logical signal through the logical output terminal thereof, said electric potential being supplied by the first power source line or the second power source line;
the third power source line;
the fourth power source line as set to be the electric potential equal to or higher than that of said second power source line; and
a voltage output portion having the first through the fifth transistors,
wherein said first transistor is a transistor of the first conductive type, of which the source is connected to said third power source line, the drain is connected with the voltage output terminal of said voltage output portion, and the gate is connected with said logical output terminal;
said second transistor is a transistor of the second conductive type, of which the source is connected with said fourth power source line, and the drain is connected with said voltage output terminal;
said third transistor is a transistor of the second conductive type, of which the source is connected with said fourth power source line, the drain is connected with the gate of said second transistor, and the gate is connected with said voltage output terminal;
said fourth transistor is a transistor of the first conductive type, of which the source is connected with the gate of said second transistor, and the drain is connected with said logical output terminal; and
said fifth transistor is a transistor of the second conductive type, of which the source is connected with said second power source line, the drain is connected with the gate of said fourth transistor, and the gate is connected with said logical output terminal.

2. A voltage translator circuit as claimed in claim 1, wherein said logical circuit portion is made up of a row decoder of a semiconductor memory device, and said voltage output terminal is connected with the word line of said semiconductor memory device.

3. A voltage translator circuit as claimed in claim 2, wherein said row decoder is provided with a NOR gate and a buffer, and to said NOR gate are the inverted value of the mth bit of an address signal, the inverted value of the (m+1)th bit of the address signal, and an activated signal according to the negative logic inputted.

4. A voltage translator circuit as claimed in claim 1, wherein each electric potential of said second power source line and said fourth power source line is set to be 2.2V.

5. A voltage translator circuit comprising:
a logical circuit portion outputting an electric potential in the form of a logical signal through the logical output terminal thereof, said electric potential being supplied from the first power source line or the second power source line;
the third power source line;
the fourth power source line as set to be the electric potential equal to or higher than that of said second power source line; and
a voltage output portion having the first through the sixth transistors,
wherein said first transistor is a transistor of the first conductive type, of which the source is connected with said third power source line, the drain is connected with the voltage output terminal of said voltage output portion, and the gate is connected with said logical output terminal;
said second transistor is a transistor of the second conductive type, of which the source is connected with said fourth power source line, and the drain is connected with said voltage output terminal;
said third transistor is a transistor of the second conductive type, of which the source is connected with said fourth power source line, the drain is connected with the gate of said second transistor, and the gate is connected with said voltage output terminal;
said fourth transistor is a transistor of the first conductive type, of which the source is connected with the gate of said second transistor, and the drain is connected with said logical output terminal;
said fifth transistor is a transistor of the second conductive type, of which the source is connected with said second power source line, the drain is connected with the gate of said fourth transistor, and the gate is connected with said logical output terminal;
said sixth transistor is a transistor of the first conductive type, of which the source is connected with said first power source line, the drain is connected with the gate of said second transistor, and the gate receives the inverted value of said logical signal.

6. A voltage translator circuit as claimed in claim 5, wherein said logical circuit portion is made up of a row decoder of a semiconductor memory device, and said voltage output terminal is connected with the word line of said semiconductor memory device.

7. A voltage translator circuit as claimed in claim 6, wherein said row decoder is provided with a NOR gate and a buffer, and to said NOR gate are the inverted value of the mth bit of an address signal, the inverted value of the (m+1)th bit of the address signal, and an activated signal according to the negative logic inputted.

8. A voltage translator circuit as claimed in claim 5, wherein each electric potential of said second power source line and said fourth power source line is set to be 2.2V.

9. A semiconductor memory device comprising:
a row decoder outputting an electric potential in the form of a logical signal through the logical output terminal thereof, said electric potential being supplied by the first power source line or the second power source line;
the third power source line;
the fourth power source line as set to be the electric potential equal to or higher than that of said second power source line;
a voltage output portion having the first through the fifth transistors; and
a set of word lines connected with the voltage output terminal of said voltage output portion,
wherein said first transistor is a transistor of the first conductive type, of which the source is connected with said third power source line, the drain is connected with the voltage output terminal of said voltage output portion, and the gate is connected with said logical output terminal;
said second transistor is a transistor of the second conductive type, of which the source is connected with said fourth power source line, and the drain is connected with said voltage output terminal;
said third transistor is a transistor of the second conductive type, of which the source is connected with said fourth power source line, the drain is connected with the gate of said second transistor, and the gate is connected with said voltage output terminal;
said fourth transistor is a transistor of the first conductive type, of which the source is connected with the gate of said second transistor, and the drain is connected with said logical output terminal; and
said fifth transistor is a transistor of the second conductive type, of which the source is connected with said second power source line, the drain is connected with the gate of said fourth transistor, and the gate is connected with said logical output terminal.

10. A semiconductor memory device as claimed in claim 9, wherein said row decoder is provided with a NOR gate and a buffer, and to said NOR gate are the inverted value of the mth bit of an address signal, the inverted value of the (m+1)th bit of the address signal, and an activated signal according to the negative logic inputted.

11. A semiconductor memory device as claimed in claim 9, wherein each electric potential of said second power source line and said fourth power source line is set to be 2.2V.

12. A semiconductor memory device comprising:
a row decoder outputting an electric potential in the form of a logical signal through the logical output terminal thereof, said electric potential being supplied from the first power source line or the second power source line;
the third power source line;
the fourth power source line as set to be the electric potential equal to or higher than that of said second power source line;
a voltage output portion having the first through the sixth transistors; and
a set of word lines connected with the voltage output terminal of said voltage output portion,
wherein said first transistor is a transistor of the first conductive type, of which the source is connected with said third power source line, the drain is connected with the voltage output terminal of said voltage output portion, and the gate is connected with said logical output terminal;
said second transistor is a transistor of the second conductive type, of which the source is connected with said fourth power source line, and the drain is connected with said voltage output terminal;

said third transistor is a transistor of the second conductive type, of which the source is connected with said fourth power source line, the drain is connected with the gate of said second transistor, and the gate is connected with said voltage output terminal;

said fourth transistor is a transistor of the first conductive type, of which the source is connected with the gate of said second transistor, and the drain is connected with said logical output terminal;

said fifth transistor is a transistor of the second conductive type, of which the source is connected with said second power source line, the drain is connected with the gate of said fourth transistor, and the gate is connected with said logical output terminal;

said sixth transistor is a transistor of the first conductive type, of which the source is connected with said first power source line, the drain is connected with the gate of said second transistor, and the gate receives the inverted value of said logical signal.

13. A semiconductor memory device as claimed in claim 12, wherein said row decoder is provided with a NOR gate and a buffer, and to said NOR gate are the inverted value of the mth bit of an address signal, the inverted value of the (m+1)th bit of the address signal, and an activated signal according to the negative logic inputted.

14. A semiconductor memory device as claimed in claim 12, wherein each electric potential of said second power source line and said fourth power source line is set to be 2.2V.

* * * * *